United States Patent
Giannantonio et al.

(10) Patent No.: US 7,842,194 B2
(45) Date of Patent: Nov. 30, 2010

(54) DISPENSING SYSTEM FOR ALKALI METALS CAPABLE OF RELEASING A HIGH QUANTITY OF METALS

(75) Inventors: Roberto Giannantonio, Oleggio (IT); Lorena Cattaneo, Busto Arsizio (IT); Antonio Bonucci, Milano (IT)

(73) Assignee: Saes Getters S.p.A., Lainate (IT)

(*) Notice: Subject to any disclaimer, the term of this patent is extended or adjusted under 35 U.S.C. 154(b) by 799 days.

(21) Appl. No.: 11/791,559

(22) PCT Filed: Nov. 18, 2005

(86) PCT No.: PCT/IT2005/000674
§ 371 (c)(1),
(2), (4) Date: May 24, 2007

(87) PCT Pub. No.: WO2006/057021
PCT Pub. Date: Jun. 1, 2006

(65) Prior Publication Data
US 2007/0267434 A1    Nov. 22, 2007

(30) Foreign Application Priority Data
Nov. 24, 2004    (IT) .......................... MI2004A2279

(51) Int. Cl.
*H01J 7/18*    (2006.01)
*H01J 35/20*    (2006.01)
*H01K 1/56*    (2006.01)

(52) U.S. Cl. .................... 252/181.4; 252/514; 118/715; 118/726

(58) Field of Classification Search ................. 252/514, 252/181.4; 141/331 R; 222/3, 129; 392/389; 427/248.1, 70; 445/10; 118/715, 726
See application file for complete search history.

(56) References Cited

U.S. PATENT DOCUMENTS

| 2,117,735 | A |   | 5/1938 | Lester |
| 3,578,834 | A |   | 5/1971 | Della Porta et al. |
| 3,579,459 | A |   | 5/1971 | Della Porta et al. |
| 3,598,384 | A |   | 8/1971 | Zucchinelli |
| 3,636,302 | A | * | 1/1972 | Porta et al. .................. 392/389 |
| 3,658,713 | A |   | 4/1972 | Irisaka et al. |
| 3,663,121 | A |   | 5/1972 | Della Porta et al. |

(Continued)

FOREIGN PATENT DOCUMENTS

EP    949696 A2    10/1999

(Continued)

*Primary Examiner*—Mark Kopec
*Assistant Examiner*—Khanh Tuan Nguyen
(74) *Attorney, Agent, or Firm*—Panitch Schwarze Belisario & Nadel LLP

(57) ABSTRACT

A dispensing system is provided for alkali metals, that allows increasing the quantity of alkali metal that can be dispensed, as well as the time during which the system can be used with properties of metal vapors release which are constant over time. The system includes an alkali metal dispenser, the dispenser being a metallic container having one or more first openings and containing a mixture of one or more alkali metal compounds and one or more reducing compounds, preferably in the form of loose powders or pellets of the powders. The system further includes a metallic shield which substantially encloses the container and has one or more second openings facing the first openings.

7 Claims, 2 Drawing Sheets

U.S. PATENT DOCUMENTS

| | | | |
|---|---|---|---|
| 3,667,513 A * | 6/1972 | Della Porta et al. | 141/311 R |
| 3,945,949 A * | 3/1976 | Van Vucht et al. | 252/514 |
| 4,195,891 A * | 4/1980 | Hellier | 445/10 |
| 4,233,936 A | 11/1980 | Longsderff et al. | |
| 4,415,605 A | 11/1983 | Davis et al. | |
| 5,182,567 A | 1/1993 | Wilder | |
| 6,013,384 A | 1/2000 | Kido et al. | |
| 6,255,774 B1 | 7/2001 | Pichler | |
| 6,753,648 B2 | 6/2004 | Boffito et al. | |
| 2004/0001916 A1 * | 1/2004 | Boffito et al. | 427/248.1 |

FOREIGN PATENT DOCUMENTS

| | | | |
|---|---|---|---|
| EP | 845924 B1 | | 7/2003 |
| GB | 715284 | | 9/1954 |
| JP | 60 116771 A | | 6/1985 |
| JP | 02-225659 | * | 9/1990 |
| JP | 02 225659 A | | 9/1990 |
| JP | 4-259744 A | | 9/1992 |
| JP | 9-078058 A | | 3/1997 |
| WO | 01/31081 A1 | | 5/2001 |
| WO | 2006/027814 A2 | | 3/2006 |

* cited by examiner

DISPENSING SYSTEM FOR ALKALI METALS CAPABLE OF RELEASING A HIGH QUANTITY OF METALS

CROSS-REFERENCE TO RELATED APPLICATIONS

This application is a Section 371 of International Application No. PCT/IT2005/000674, filed Nov. 18, 2005, which was published in the English language on Jun. 1, 2006, under International Publication No. WO 2006/057021, the disclosure of which is incorporated herein by reference.

BACKGROUND OF THE INVENTION

The present invention relates to a dispensing system for alkali metals capable of releasing a high quantity of these metals.

Alkali metals have been used in the field of electronics for a long time. In particular, these metals have been used in the past for the manufacturing of photosensitive surfaces, e.g. of image amplifiers or photomultiplier tubes, obtained by condensation of metal vapors onto inner walls of these devices.

Due to the high reactivity of alkali metals to atmospheric gases and to humidity, the evaporation sources generally used in industry are not the pure metals, but rather their compounds that are stable in air at room temperature in mixtures with reducing agents. The alkali metal compounds most commonly used are chromates, $M_2CrO_4$, but also used are molybdates, $M_2MoO_4$, tungstates, $M_2WO_4$, niobates, $MNbO_3$, tantalates, $MTaO_3$, titanates, $M_2TiO_3$, and similar salts (in these formulas M indicates any alkali metal); aluminum, silicon, or getter alloys, that is alloys based on titanium or zirconium with aluminum or one or more transition elements, are normally used as reducing agents. To favor the contact between the alkali metal compound and the reducing agent, both are preferably used in form of powders, with a particle size that is preferably smaller than 500 micrometers (µm); the weight ratio between the alkali metal compound and the reducing agent is generally comprised between 10:1 and 1:10. Mixtures of this type are described, for example, in British Patent GB 715,284, and U.S. Pat. Nos. 2,117,735; 3,578,834; 3,658,713; and 6,753,648, and in International patent application PCT/IT2005/000509.

These mixtures are normally used inside suitable dispensers capable of holding solid particles, but having at least a part of the surface permeable to alkali metal vapors, as shown for example in U.S. Pat. Nos. 3,578,834; 3,579,459; 3,598,384; 3,636,302; 3,663,121; and 4,233,936, and in Japanese patent application publication JP-A-4-259744. These dispensers are formed by a container, generally metallic, inside which there are loose powders or pellets of the dispensing mixtures. The heating of the mixtures is achieved by directly passing electric current through the walls of the dispenser, which then release heat by contact with the powders or pellets therein.

The dispensers disclosed in these patents are suitable for releasing small quantities of alkali metals, up to some tens of milligrams (see e.g., the dispenser described in Japanese patent application publication JP-A-4-259744, containing two pellets of the mixture). The release mode of these dispensers is such that once heated to the reaction temperature of the contained mixture, the alkali metal is completely released within a short time, whereupon the dispenser is exhausted. These operative characteristics are suitable for the formation of thin alkali metal layers in conventional applications, that is photomultipliers and image amplifiers.

Recently, the alkali metals, particularly lithium and cesium, have found a new application field in OLED screens (standing for "Organic Light Emitting Display"). Due to the importance of this application, reference is particularly made to this application in the following text, but the invention is of a more general applicability. The functioning principle of OLEDs is the recombination of electrons and electronic vacancies (or "holes") inside a multilayer of different organic materials, interposed between two series of electrodes. For a detailed description of structure and operation of OLEDs reference can be made, for example, to European published patent applications EP-A-845924 and EP-A-949696; Japanese patent application publication JP-A-9-078058; and U.S. Pat. No. 6,013,384. The addition of small quantities of electron-donor metals, particularly alkali metals, to the structure of an OLED, allows reduction of the energy consumption of these screens. U.S. Pat. No. 6,013,384 describes the use of these metals as dopant for one or more layers of the organic multilayer, while U.S. Pat. No. 6,255,774 describes the use of these metals for the formation of very thin layers (less than 5 nanometers) between a series of electrodes (cathodes) and the adjacent organic layer. Both the formation of the organic multilayers and the addition of the alkali metals are obtained by evaporating the metals inside a deposition chamber, in which a substrate is placed being kept at such a temperature to allow the condensation of the vapors and the resulting formation of the desired thin layers.

In contrast to conventional applications, manufacturing on a very large scale is foreseen in the case of OLEDs, on the order of tens of million of pieces per year. To reach these numbers it is necessary to make use of continuous production (apart from short breaks for the cleaning of the chambers and the replacement of the evaporation sources). Also, the alkali metal dispensers must be able to operate for much longer times than was required in the past, for example in continuous cycles of about one week.

The prior art dispensers are not able to satisfy these requirements, while the simple increase of their dimensions has proved to be useless in practice.

In fact, with prior art dispensers, an increase of the dimensions with constant geometric shape would result in the decrease of the fraction of dispensing mixture in direct contact with the walls. Consequently, the thermal contact with the walls is good only for a fraction of the mixture that is smaller, the larger the dimensions of the dispenser, while the portions of the mixture further away from the walls receive heat only through the rest of the mixture, thus not efficiently due to the poor thermal conductivity properties of these mixtures.

Further, when using the mixtures described before, if an extension of the time of metal release is desired, it is necessary to progressively increase the temperature, in order to balance the reduction of the residual quantity of alkali metal in the container over time. By employing small dispensers, as those used up to now, this does not bring serious problems. Vice versa, increasing the dimensions of the dispensers, an increase in temperature of their walls implies a larger heat dissipation inside the process chamber. In these chambers control of the quantity of the deposited material is usually monitored during the process by devices called Quartz Crystal Microbalances (QCM) suitably positioned within the chamber. The actual sensor element of a QCM is composed of a quartz crystal, whose basic vibration frequency changes as a function of the weight of material deposited on it. By measuring the change of the vibration frequency with time with constant applied electric field, it is possible to determine the increase of weight of the material deposited on the crystal and, through the knowledge of the density of the material being deposited, the variation with time of the deposited thickness. An alkali dispenser of great size, by releasing considerable amounts of heat, can also heat up the quartz crystals by radiation, thereby increasing their temperature. Since the vibration frequency depends also on this latter parameter, there is an interference with the measurement of the deposit thickness, whereby precision in the process control is lost.

BRIEF SUMMARY OF THE INVENTION

The object of the present invention is to provide a dispensing system for alkali metals without the problems of the known dispensers. In particular, the object of the invention is to provide a dispensing system for alkali metals capable of releasing high quantities of these metals, with flow rates nearly constant during periods of about one week and with a limited heat emission in the evaporation chamber.

This object is obtained according to the present invention with a dispensing system for alkali metals comprising:
- an alkali metal dispenser, comprised of a metallic container with one or more first openings, inside which there is a mixture of one or more alkali metal compounds and of one or more reducing compounds, wherein the mixture can be in the form of loose powders or in the form of pellets of the powders;
- a metallic shield separated from and enclosing the container, except for lateral openings, if any, for the passage of electrical feedthroughs for the heating of the container and having one or more second openings, the second openings facing the first openings.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The container of the invention may have any shape. For example, the container can have an elongated shape with a trapezoidal cross-section (a shape known in the field as "boat"), and can have extensions at the ends, particularly useful for connection to electric terminals for its heating. A container of this type is described, e.g., in U.S. Pat. No. 6,753,648 in the name of SAES Getters, S.p.A. In this case, the shield will surround at least the larger surfaces of the container, possibly with openings corresponding to the extensions at the ends of the container. The shape of the shield will be such that, at least in the zone of the first and second openings, the distance between container and shield is as small as possible. This should be compatible with the requirements of easy manufacturing, of evacuation of the interspace formed and of avoidance of thermal deformations resulting in contact between container and shield, as discussed in more detail in the following.

Figure 1:
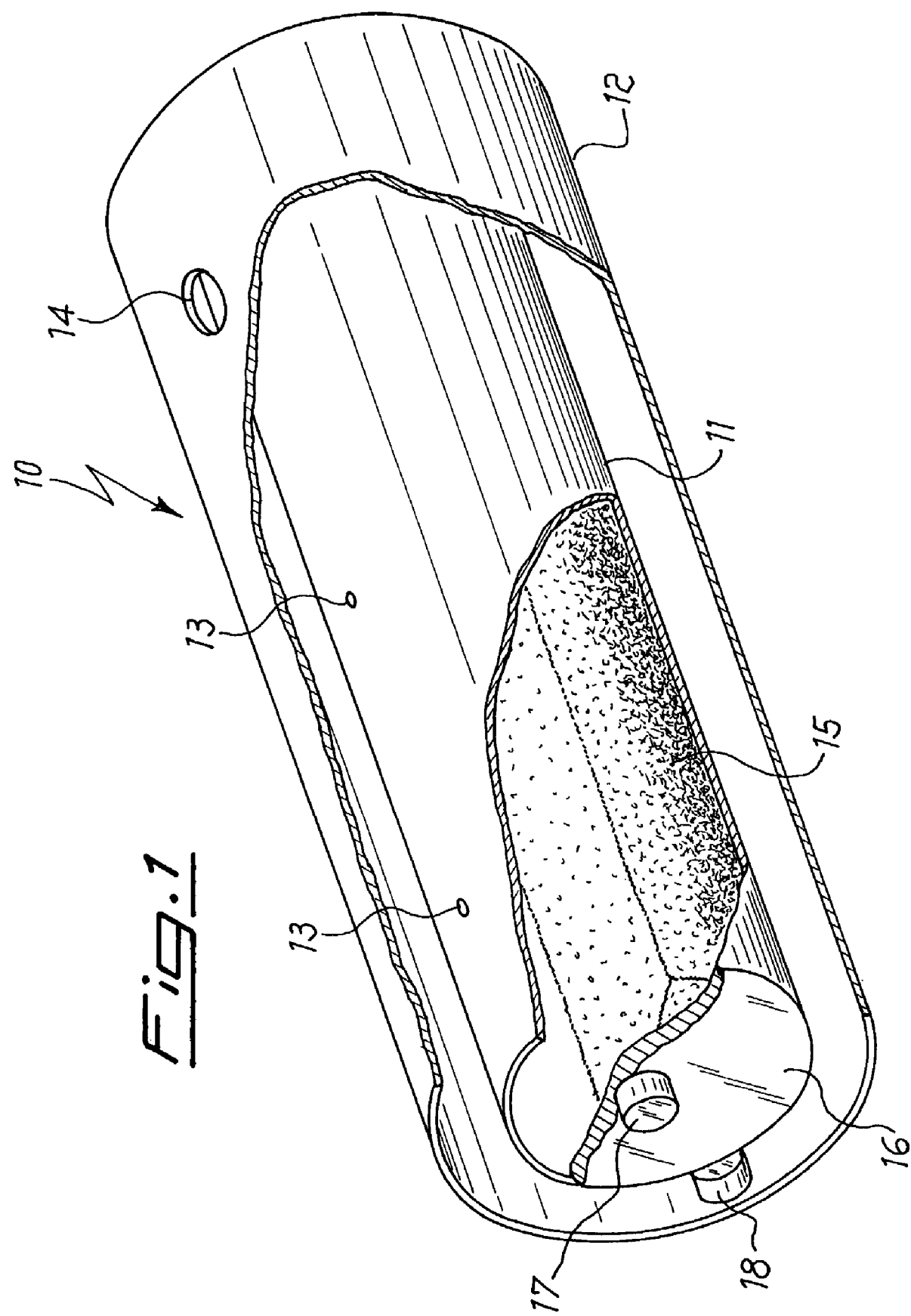
FIG. 1 is a longitudinal perspective view, partially cutaway, of a preferred embodiment of the system of the invention.
Figure 2:
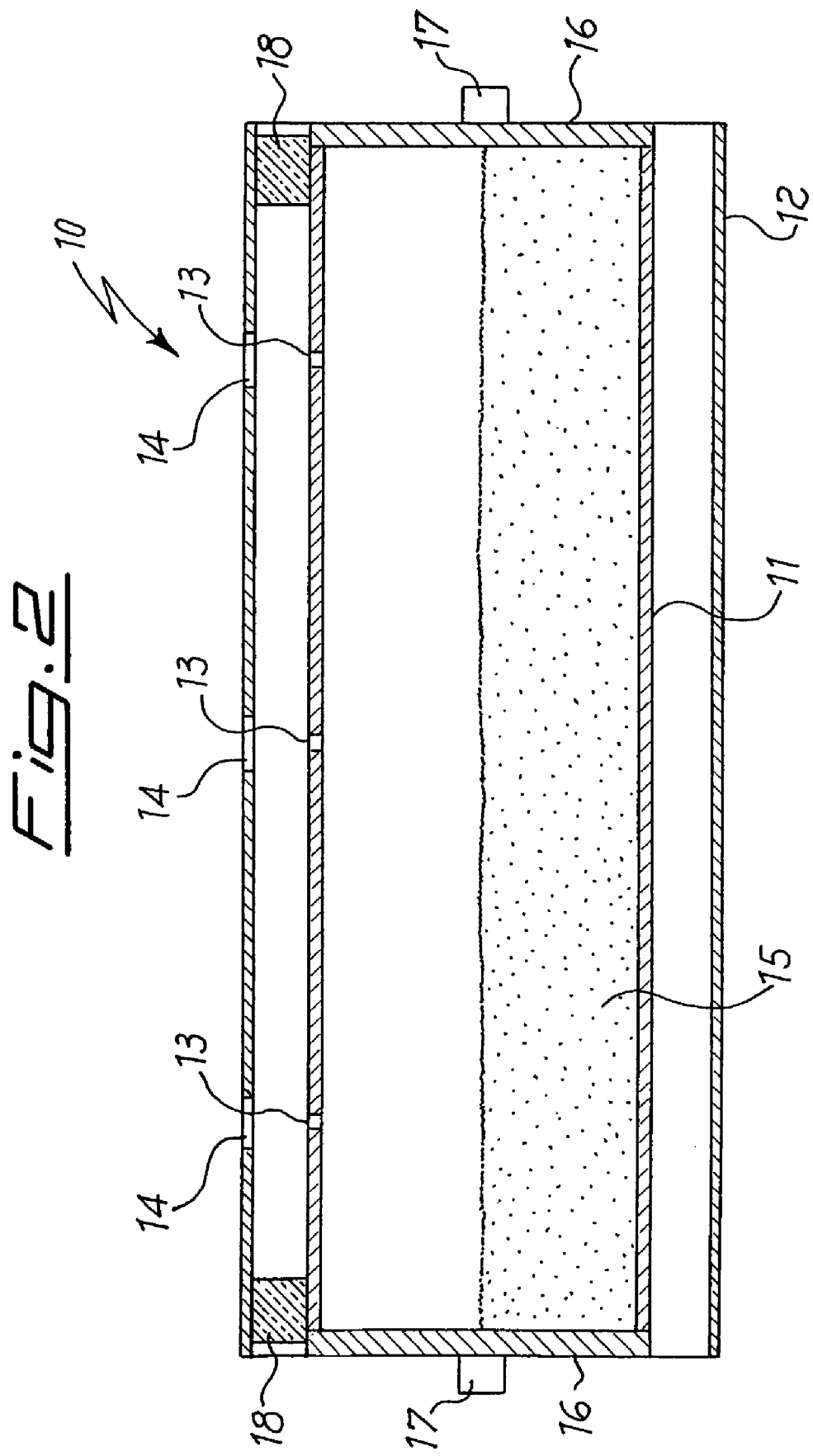
FIG. 2 is a longitudinal cross-sectional view of the system of FIG. 1.

One of the main functions of the shield is that of equalizing the temperature inside the container, thereby reducing to a minimum the problems of high thermal gradients in the dispensing mixture for alkali metals, which are present in conventional dispensers, and thus making their emission more uniform over time. For this purpose, it is preferred that both the container and the shield have a cylindrical shape with a circular cross-section. This configuration is shown in FIGS. 1 and 2. The system of the invention 10 is comprised of the container 11 and the shield 12. Container 11 has openings 13. In FIGS. 1 and 2 the case is shown of three openings of type 13 (in FIG. 1, one is hidden by the shield 12) being present, but the container could have a single opening (in this case generally in the middle of the length) or a larger number. Shield 12 has openings 14 in correspondence with openings 13 of the container. In FIG. 1 both the openings 13 and 14 are shown to have circular shapes, but they could also have other shapes, e.g., elongated slits. Inside the container there is the mixture 15 of the alkali metal compounds with the reducing compounds previously described, in the form of loose powders or compressed into pellets. Container 11 is closed at the ends by end walls 16, that can be welded to the main cylindrical wall, or that can be in the form of "plugs" inserted into the cylindrical wall. On these end walls 16 generally there are elements 17 (shown in the drawing merely as protrusions from the walls) for connection to terminals for electrical supply (not shown).

Container 11 and shield 12 are kept at the desired distance by thermally insulating spacers 18, generally of ceramics, for example three for each end of the system and positioned in axial symmetry, spaced 120° from each other (only one of these spacers is shown in FIG. 1, two in FIG. 2). Finally, the shield itself can incorporate, or be connected to, end walls (not shown in the drawing), the end walls not being in contact with the container, the elements 17 or the electrical feedthroughs (also not shown), but that approach as close as possible to these. These end walls have the purpose of avoiding the loss of a considerable amount of alkali metal vapors through the sides of the system, but at the same time must not be in contact with the inner container or the electrical feedthroughs (and even less fixed to these parts) to allow the free movement of these latter parts as a result of thermal expansions.

As previously stated, the distance between the shield and the container is the smallest possible, dependent upon constructive and operative requirements. A first advantage of keeping the shield very close to the container 11 is to reduce the so-called "view factor", that is the radiation to the outside from the container 11 (and thus the heating of the other elements present in the process chamber). In other words, the function of thermal insulation is better, the closer the shield is to the container 11. On the other hand, the shield cannot be brought indefinitely close to the container, first due to constructive problems (e.g., the availability of ceramic spacers of a very small thickness); second, because the shield and container in any case undergo during their life deformations due to thermal cycling. If these two elements are too close, they could even get in touch, in which case the shield would be heated by conduction and would become itself a primary source of radiation heating. Finally, before starting the manufacturing steps in the deposition chambers, all components must be evacuated, and a too small thickness of the interspace between shield and container would make the evacuation thereof very difficult. As a result of these opposite requirements, suitable values of the spacing between shield 12 and container 11 are between 0.5 and 5 millimeters.

The openings 13 (of the container) and 14 (of the shield) are aligned, with the openings 14 being generally co-axial with the openings 13. The ratio between the size of the openings 14 and of the openings 13 is generally determined by the distance between shield and dispenser and by the position of the dispensing system with respect to the substrate onto which the alkali metal is to be evaporated. Generally, the size of openings 14 is about 2 to 10 times the size (diameter in the case of circular openings) of openings 13. At the typical pressures of the process for which the system of the invention is intended, the alkali metal vapors move in the molecular regime, and in these conditions too small dimensions of the openings 14 (e.g., identical to those of openings 13) would result in too focused metal vapor beams, with consequent difficulties in obtaining uniform deposits. Vice versa, excessive dimensions of the openings 14 would result in the formation of excessive alkali metal deposits onto undesired parts of the process chamber.

The shield must be made of a material with a low radiative thermal emissivity, in order to avoid or anyhow reduce the above-described problem of heating of the QCM microbalances. For this purpose, polished stainless steels (austenitic, martensitic and ferritic), possibly coated (e.g. nickel-plated steels), non-ferrous alloys based on Ni-Cr and pure metals, such as silver or tantalum can be used. The same materials can be used for the manufacturing of container 11. Assuming use of the same material for container and shield, the external surfaces of both container 11 and shield 12 will preferably be polished (possibly nickel-plated), to minimize thermal emission by radiation.

An evaporation system for metals similar to that of the invention is described in U.S. Pat. No. 5,182,567. In the system of this patent, however, the shield has essentially the function of avoiding the emission of small drops of melted metal from the inner container, while the function of increasing the thermal uniformity is less relevant, because in that case the application is the evaporation of metal vapors (especially aluminum) from molten baths, which are characterized by intrinsically having already a high temperature uniformity. As a result of these differences in use, the shield of U.S. Pat. No. 5,182,567 is made of ceramic materials, such as boron nitride, aluminum nitride or silicon nitride, or titanium boride (which among others has a very high thermal conductivity, and thus could not accomplish the function of thermal insulation towards the outside of the shield of the present invention). Further, again because of the different intended uses, the shield of the cited U.S. patent preferably has a wide opening in the lower part, which instead is not desirable in the present case for obtaining an efficient effect of thermal homogenization of the mixture in the container 11.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A dispensing system for alkali metals comprising:
   an alkali metal dispenser comprising a metallic container having at least one first opening, and inside the container a mixture of at least one alkali metal compound and at least one reducing compound, wherein the mixture has a form of loose powders or pellets of the powders; and
   a metallic shield separated from and enclosing the container, except for optional lateral openings for passage of electrical feedthroughs for heating the container, the shield having at least one second opening, the at least one second opening facing the first openings;
   wherein the at least one second opening has a dimension about 2 to 10 times that of the at least one first opening, and wherein the container and the shield are spaced from each other by a distance of about 0.5 to 5 millimeters.

2. The system according to claim 1, wherein the container and the shield have a circular cross-section.

3. The system according to claim 1, wherein the container and the shield are kept at the spaced distance by thermally insulating spacers.

4. The system according to claim 3, wherein the spacers are made of ceramics.

5. The system according to claim 1, wherein the shield is made of a material selected from the group consisting of stainless steels, non-ferrous alloys based on Ni-C, silver, and tantalum.

6. The system according to claim 5, wherein the steels are polished and/or coated by nickel plating.

7. The system according to claim 1, wherein the container and the shield are made of the same metal.

* * * * *